(12) United States Patent
Shin et al.

(10) Patent No.: US 6,866,968 B2
(45) Date of Patent: Mar. 15, 2005

(54) PHOTOMASK FOR OFF-AXIS ILLUMINATION AND METHOD OF FABRICATING THE SAME

(75) Inventors: In-Kyun Shin, Suwon (KR); Jung-min Sohn, Yongin (KR); Hee-sun Yoon, Yongin (KR); Seong-woon Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 54 days.

(21) Appl. No.: 10/216,925

(22) Filed: Aug. 13, 2002

(65) Prior Publication Data

US 2003/0148193 A1 Aug. 7, 2003

(30) Foreign Application Priority Data

Feb. 6, 2002  (KR) ................................ 10-2002-0006836

(51) Int. Cl.[7] ................................................ G03F 9/00
(52) U.S. Cl. ............................................................ 430/5
(58) Field of Search ........................... 430/5, 322, 323, 430/324; 378/35, 15

(56) References Cited

U.S. PATENT DOCUMENTS 6,249,335 B1 * 6/2001 Hirukawa et al. ............ 355/53

FOREIGN PATENT DOCUMENTS

| JP | 9050117 | 2/1997 |
|---|---|---|
| KR | P1995-0021041 | 7/1995 |
| KR | P1996-059820 | 8/1998 |
| KR | P1998-040598 | 8/1998 |

* cited by examiner

Primary Examiner—S. Rosasco
(74) Attorney, Agent, or Firm—Volentine Francos & Whitt, PLLC

(57) ABSTRACT

A photomask that is capable of implementing off-axis illumination (OAI), and a method of fabricating the same, are provided. The photomask includes a transparent substrate, a plurality of opaque patterns formed on the front surface of the transparent substrate, for defining a floodlighting portion for forming patterns, and a plurality of phase gratings formed on the back surface of the transparent substrate, allowing off-axis illumination (OAI) of an incident light source beyond the OAI limit of exposure equipment, allowing use in the outmost region of an aperture, and allowing modified illumination having a shape suitable for the layout of the opaque patterns.

30 Claims, 13 Drawing Sheets

PHOTOMASK FOR OFF-AXIS ILLUMINATION AND METHOD OF FABRICATING THE SAME

CROSS REFERENCES TO RELATED APPLICATIONS

This application claims priority under 35 U.S.C. §119 from Korean Patent Application No. 2002-6836, filed on 6 Feb. 2002, the contents of which are hereby incorporated by reference in their entirety as if fully set forth herein.

BACKGROUND OF THE INVENTION

1. Field of the Invention

The present invention relates to a photomask for fabricating a semiconductor device, and a method of fabricating the same, and more particularly, to a photomask on which phase gratings are formed for off-axis illumination (OAI), and a method of fabricating the same.

2. Description of the Related Art

Photomask images or patterns, which define various elements in a photolithographic process, are focused onto photoresist using light. In order to implement tiny features, finer images must be focused on the photoresist, and optical resolution must be increased. However, there are limits to the resolution which can be attained.

Thus, in order to fabricate a semiconductor device near the resolution limit of a photolithographic process, resolution enhancement techniques must be used. Resolution enhancement techniques include a method of using a light source having a wavelength smaller than that in prior art, a method of using a phase shift mask, and a method of using off-axis illumination (OAI), which is modified illumination.

Theoretically, in the case of using OAI, resolution is about 1.5 times higher than when using conventional illumination, and depth of focus (DOF) is also increased. As a semiconductor device becomes highly integrated, it is important to improve DOF, because there is always some unevenness on a wafer on which patterns are projected, due to preformed patterns or bending of the wafer, and the exposure of photoresist on the wafer surface or in all places of each chip is not performed on same focus surface.

One method of implementing OAI is to install in exposure equipment a modified aperture having an annular, dipole or quadripole optical transmission region, instead of a conventional aperture having a circular optical transmission region. In this method, the vertical component of incident light is cut off, and only a sloped component (that is, an off-axis component) reaches the photomask. In this case, the intensity of light emitted from the light source is reduced while passing through the modified aperture.

Another method is to attach an additional mask having phase gratings (hereinafter referred to as a grating mask) to the back surface of a photomask using a conventional aperture. In the method, light is diffracted by the phase gratings, so the vertical component of the light is offset and only an off-axis component is transmitted into a projection lens, and only light passing through the projection lens interferes with itself on a wafer on which the photoresist is coated, forming images from the light. The intensity of light is not reduced as when using the modified aperture, but problems may occur when the grating mask is attached to the back surface of the photomask. Various losses and uncontrollable reasonable factors, such as that the grating mask must be detached and reattached for cleaning after being used for a certain time, are inherent in this method, and thus, it is practically impossible to employ the method in mass production.

FIGS. 1 and 2 illustrate a conventional grating mask, showing the illumination pattern on the right corresponding to the shape of the grating mask on the left. For reference, the simulation tool used in the present invention was SOLID-C. Bright portions in the drawings illustrating the illumination shape are optical transmission regions, and dark portions are optical cutoff regions.

FIG. 1 illustrates a grating mask 10 on which a phase grating 5 comprising an alternating pattern of lines and spaces is formed at a constant interval, and the grating mask 10 phase-shifts incident light by 180°. In this case, illumination having a dipole shape is implemented, as shown in the right of FIG. 1. The illumination having a dipole shape has a different illumination effect on patterns in a horizontal or vertical direction, and thus is effective when line & space patterns are transferred onto a wafer.

FIG. 2 illustrates a grating mask 20 on which a checkered phase grating 15 is formed, to phase-shift incident light by 180°. In this case, illumination having a quadripole shape is implemented, as shown in the right of FIG. 2. The illumination having a quadripole shape has the same modified illumination effect on patterns in horizontal and vertical directions. Thus, the illumination having a quadripole shape is used to effectively transfer isolated patterns.

However, when patterns transferred onto the wafer have pitches in an x-direction, a y-direction, and a diagonal direction, at different intervals, it is very difficult to form patterns in the x and y-directions and the diagonal direction under only one illumination condition. There is very restricted ability to obtain a desired critical dimension (CD) with respect to the directions, and thus, it is impossible to obtain a process margin. In order to obtain the process margin, illumination conditions that are suitable for various pattern shapes are required.

In addition, in the conventional OAI method, the OAI limit of the exposure equipment is determined by a numerical aperture (NA) of a condenser lens included in the exposure equipment. However, as design rules quickly diminish, it becomes difficult to obtain the desired process margin from the OAI of the exposure equipment. In this case, the only options are to find new techniques or to use exposure equipment having a higher NA. However, it is far cheaper to use conventional exposure equipment having lower NA. In this case, since it is very difficult under the present circumstances to obtain process capabilities through the resolution enhancement technique, a method is required by which the OAI limit of the exposure equipment can be overcome.

SUMMARY OF THE INVENTION

To solve the above problems, it is a first object of the present invention to provide a photomask in which the off-axis illumination (OAI) limit of exposure equipment can be overcome, to improve wafer process capability by providing illumination conditions that are suitable for the layout of various patterns, while using the present, existing, exposure equipment without change.

It is a second object of the present invention to provide a method of fabricating a photomask suitable for mass production, by solving the conventional problem of detaching and reattaching the grating mask to the back surface of the photomask.

Accordingly, to achieve the first object, there is provided a photomask. The photomask includes a transparent substrate, a plurality of opaque patterns formed on the front surface of the transparent substrate for defining a floodlighting portion for forming patterns, and a plurality of phase gratings formed on the back surface of the transparent substrate, allowing off-axis illumination (OAI) of an incident light source beyond the OAI limit of exposure equipment, allowing use in the outmost region of an aperture and allowing modified illumination having a shape suitable for the layout of the opaque patterns.

The plurality of phase gratings have aligned edges and are rectangular patterns arranged in a mosaic shape. The phase gratings phase-shift incident light by 180° or by less than 180°. Alternative to this, the plurality of phase gratings comprise an alternating pattern of lines and spaces, and phase-shift incident light by less than 180°.

Beneficially, the phase gratings are formed together with the transparent substrate as one body. In this case, the back surface of the transparent substrate is etched, and thereby the phase gratings are formed, or a material layer having a phase difference that is formed on the back surface of the transparent substrate is etched, and thereby the phase gratings are formed. Beneficially, the material layer is a spin on glass (SOG) layer.

In order to achieve the second object, there is provided a method of fabricating a photomask. A plurality of opaque patterns are formed on the front surface of a transparent substrate for defining a floodlighting portion for forming patterns. A plurality of phase gratings, are formed on the back surface of the transparent substrate, allowing off-axis illumination (OAI) of an incident light source beyond the OAI limit of exposure equipment, allowing use in the outmost region of an aperture, and allowing modified illumination having a shape suitable for the layout of the opaque patterns, together with the transparent substrate as one body.

The step of forming a plurality of phase gratings includes coating resist on the back surface of the transparent substrate, exposing and developing the resist and forming resist patterns for desired phase gratings, etching the back surface of the transparent substrate using the resist patterns as an etching mask, and removing the resist patterns.

The step of forming resist patterns is performed using laser exposure equipment. Otherwise, before the step of coating resist, the method further includes forming a charging protection layer on the back surface of the transparent substrate, and the step of forming resist patterns is performed using c-beam exposure equipment.

In order to improve the adhesive force of the resist to the transparent substrate, a chrome layer is formed on the back surface of the transparent substrate, before the step of coating resist. The chrome layer is etched using the resist patterns as an etching mask to form chrome patterns. The step of etching the back surface of the transparent substrate is performed using the chrome patterns and the resist patterns as an etching mask, and the chrome patterns are removed in the step of removing the resist patterns.

The step of etching the back surface of the transparent substrate is performed using dry etching and wet etching together. The step of etching the back surface of the transparent substrate is divided into a plurality of steps, and for phase control and improvement of uniformity, an etch rate is calculated in each step and the calculated etch rate is applied in the subsequent step.

Beneficially, the phase gratings are formed together with the photomask as one body on the back surface of the photomask, and thereby overcoming the OAI limit of the exposure equipment, and allowing OAI of an incident light source beyond the OAI limit of the exposure equipment, allowing the phase gratings to be used in the outmost region of the aperture, and allowing modified illumination having a shape suitable for the layout of the opaque patterns.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
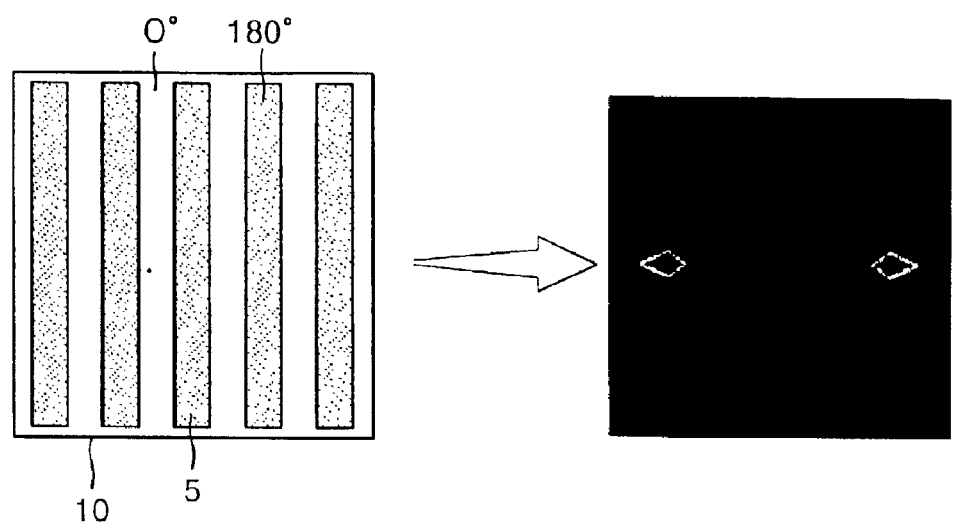
FIGS. 1 and 2 illustrate conventional grating masks, showing the illumination pattern on the right corresponding to the shape of the grating mask on the left.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. Like reference numerals refer to like elements throughout the drawings.

Figure 3:
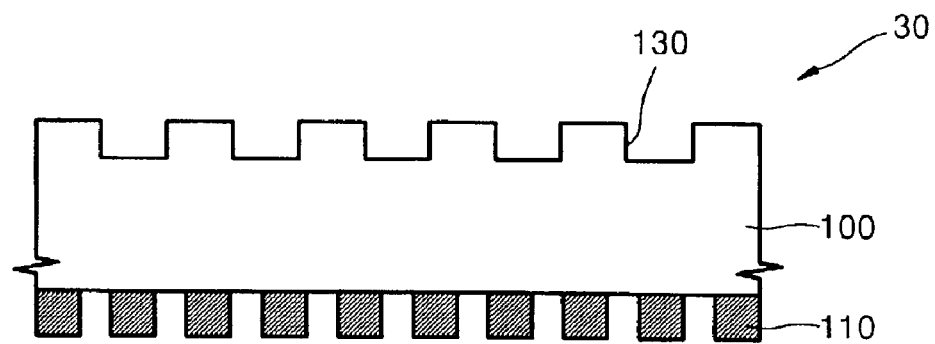
FIGS. 3 and 4 are cross-sectional views of a photomask according to first and second embodiments of the present invention, respectively.
Figure 4:
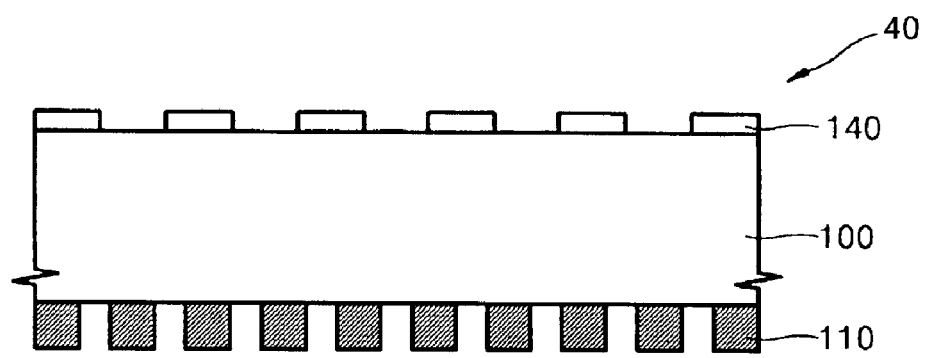

FIGS. 3 and 4 are cross-sectional views of a photomask according to first and second embodiments of the present invention, respectively.

Referring to FIG. 3, a photomask 30 according to a first embodiment of the present invention is formed on a transparent substrate 100. The transparent substrate 100 is formed of glass or quartz. A plurality of opaque patterns 110 for defining a floodlighting portion for forming patterns are formed on the front surface of the transparent substrate 100. The opaque patterns 10 may be patterns for forming a DRAM but are not limited to this. The opaque patterns 10 may be formed of a proper opaque material, for example, chrome (Cr).

A plurality of phase gratings 130 are formed on the back surface of the transparent substrate 100. As shown in FIG. 3, the plurality of phase gratings 130 have regularly periodical unevenness. Here, the phase gratings 130 are formed by etching the back surface of the transparent substrate 100.

Referring to FIG. 4, a photomask 40 according to a second embodiment of the present invention includes a transparent substrate 100, a plurality of opaque patterns 10 that are formed on the front surface of the transparent substrate 100, and a plurality of phase gratings 140 that are formed on the back surface of the transparent substrate 100. The phase gratings 140 are formed together with the transparent substrate 100 as one body. Specifically, a material layer having a phase difference, such as a spin on glass (SOG) layer, is formed on the back surface of the transparent substrate 100 and then etched to form the phase gratings 140.

Figure 5:
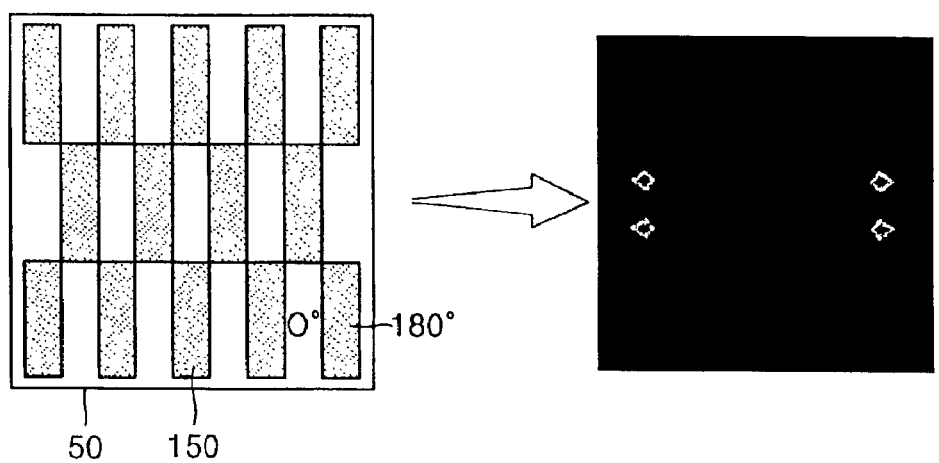
FIGS. 5 through 7 illustrate examples of phase gratings included in the photomask according to the present invention.
Figure 6:
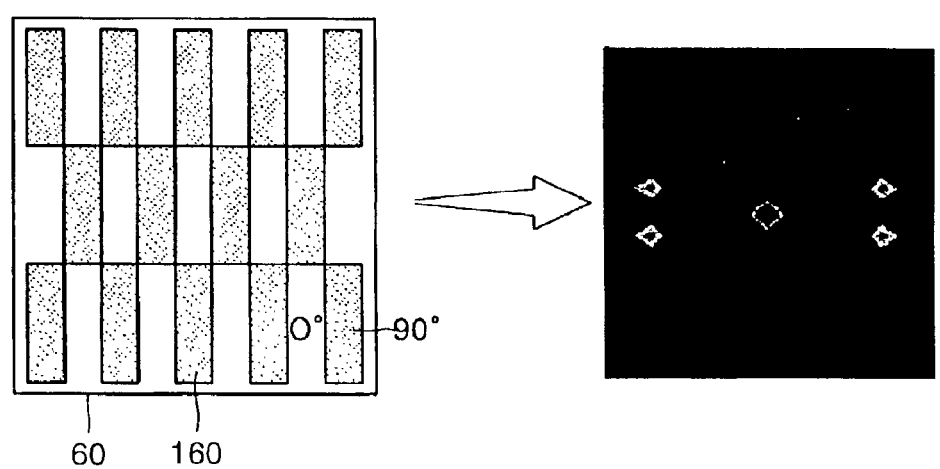
Figure 7:
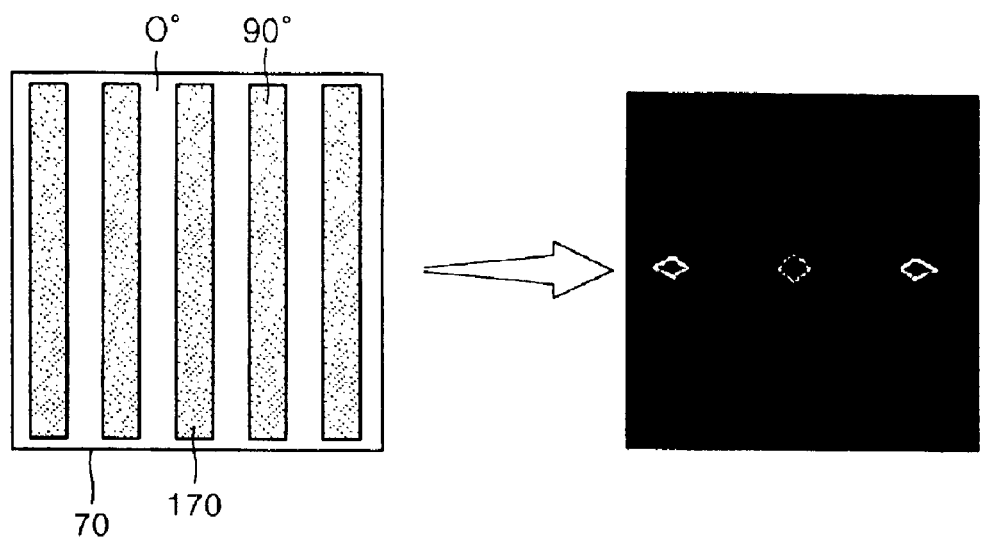

The phase gratings included in the photomasks 30 and 40 are formed to allow off-axis illumination (OAI) of an incident light source beyond the OAI limit of exposure equipment, to allow use in the outmost region of an aperture, and to allow modified illumination in a shape suitable for the layout of the opaque patterns. Although an arbitrary proper phase grating is used in the photomask, phase gratings 150, 160, and 170 shown in FIGS. 5 through 7 are particularly useful. The drawings on the right side of FIGS. 5 through 7 show the illumination shapes corresponding to the phase gratings 150, 160, and 170 shown in the drawings on the left side of FIGS. 5 through 7.

Referring to FIG. 5, a plurality of phase gratings 150 formed on the back surface of the photomask 50 have aligned edges and are rectangular patterns arranged in a mosaic shape. Here, the phase gratings 150 phase-shift incident light by 180°. Since the phase gratings 150 allow the slant OAI of the light transmitted in a vertical direction, a phase difference is caused due to the slope of the light source. In this case, as shown on the right of FIG. 5, quadripole illumination that is modified to be nearly a dipole is implemented. As the aspect ratio of the phase gratings 150 becomes larger, the quadripole comes closer to the shape of a dipole.

A plurality of phase gratings 160 formed on the back surface of a photomask 60, as shown in the left drawing of FIG. 6, have aligned edges and are rectangular patterns arranged in a mosaic shape. However, the phase gratings 160 phase-shift the incident light by less than 180°, i.e., 90°. That is, a 0-th light component is artificially transmitted into the phase gratings 160. A phase-shifted angle may depend on the layout of the opaque patterns. In this case, as shown on the right of FIG. 6, the illumination of the quadripole that is modified to be close to the dipole is combined with conventional illumination.

FIG. 7 illustrates another example of phase gratings. A plurality of phase gratings 170 formed on the back surface of a photomask 70 form an alternating pattern of lines & spaces have a line & space-type at equal intervals and phase-shift incident light by less than 180°, i.e., 90°, and thereby a 0-th light component is artificially transmitted into the phase gratings 170. The pitch of the phase gratings 170 is adjusted to a predetermined numerical aperture (NA) of the exposure equipment. In this case, as shown on the right of FIG. 7, the combination of dipole illumination with conventional illumination is obtained.

Figure 8A:
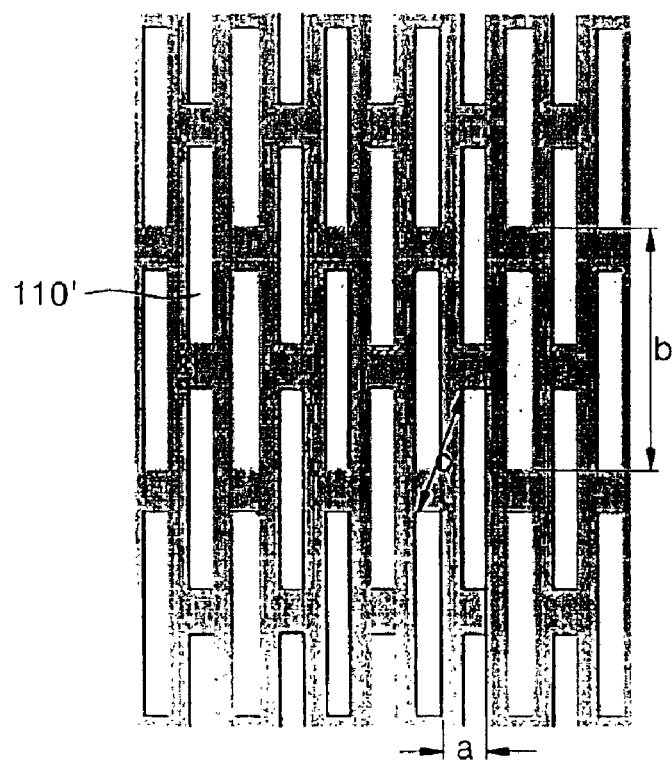
FIGS. 8A through 8C illustrate that illumination suitable for the layout of opaque patterns can be implemented by the phase gratings shown in FIG. 7.

In particular, the phase gratings 170 shown in FIG. 7 are useful for the layout of opaque patterns 110' shown in FIG. 8A. FIG. 8A does not illustrate the case of a constant, pitch like in the line & space, but illustrates a case where the opaque patterns 110' have pitch a in the x-direction, pitch b in the y-direction, and pitch c in a diagonal direction.

Figure 8B:
Figure 8C:
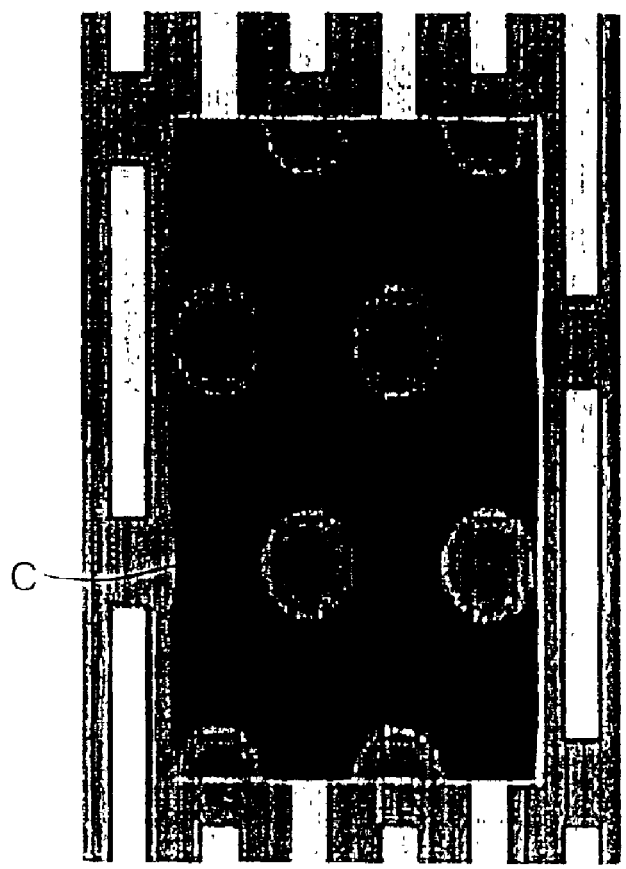

The layout of FIG. 8A may be classified as having the layout of line (A) & space (B) shown in FIG. 8B and the layout of a contact C shown in FIG. 8C. The line & space A and B of FIG. 8B may be patterned using the dipole illumination, as described in FIG. 1. The contact C of FIG. 8C may be patterned using conventional illumination.

Figure 2:
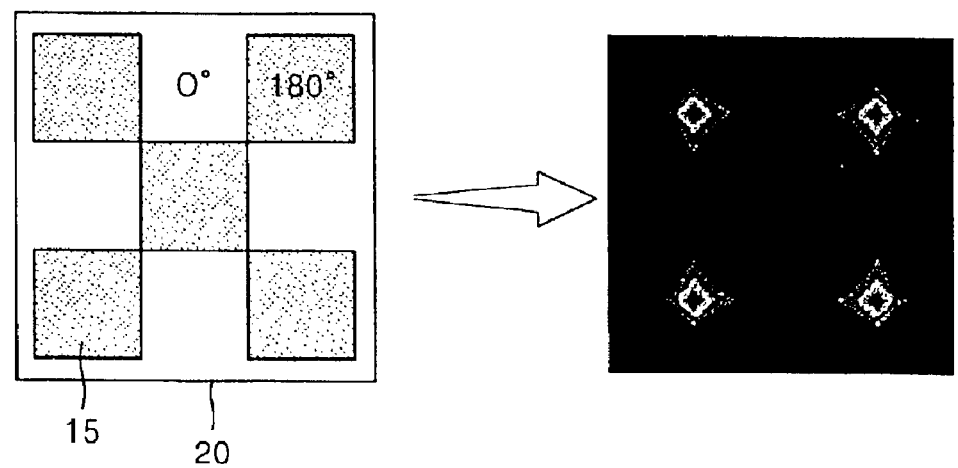

However, in the prior art described with reference to FIGS. 1 and 2, illumination conditions suitable for forming patterns having the shape of a combination of two or more layouts cannot be obtained. When patterning is performed under only one illumination condition for the original layout in which two or more layouts are combined, without considering illumination conditions suitable for each layout, the fidelity of any part is weak and thus, it becomes impossible to form patterns.

Of course, one layout may be divided into two or more layouts using a double exposure scheme on a wafer, and thereby patterning may be performed under illumination conditions suitable for each layout. However, this causes many losses, because two photomasks are required, and two photolithographic processes must be performed, making the above method difficult for mass production.

On the contrary, when phase gratings for implementing the shape of a combination of the dipole illumination and conventional illumination, as shown in FIG. 7, are formed according to the present invention, the original patterns having the shape shown in FIG. 8A may be formed with only one exposure process using a photomask.

As above, according to the present invention, modified illumination having a shape suitable for the layout of the opaque patterns can be implemented. The effect of increasing the process margin by allowing the OAI of the incident light source beyond the OAI limit of the exposure equipment, and by using the phase gratings in the outmost region of the aperture, which is another feature of the present invention, will be described with reference to FIGS. 9A through 9C.

Figure 9A:
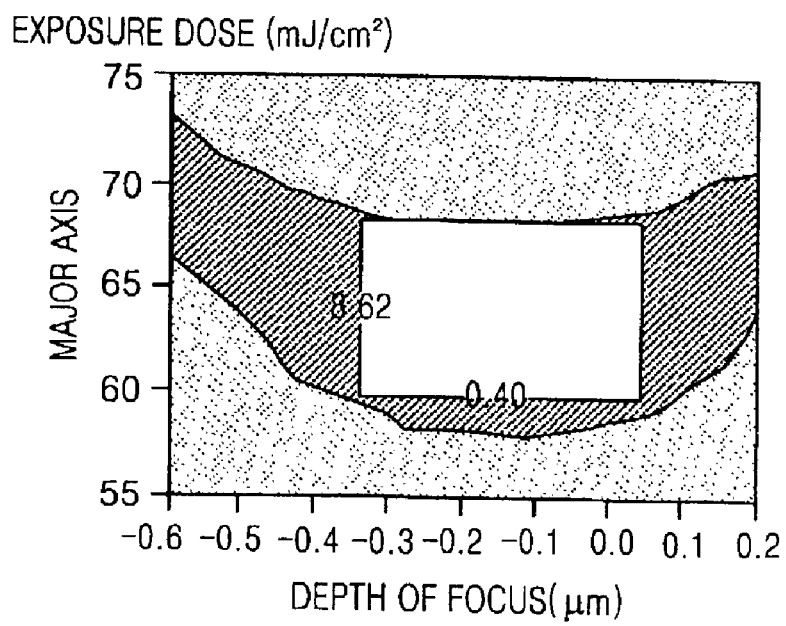
FIGS. 9A through 9C are graphs comparing the implementation of off-axis illumination (OAI) with that in the prior art, in order to verify the effect of obtaining a process margin according to the present invention.
Figure 9A:
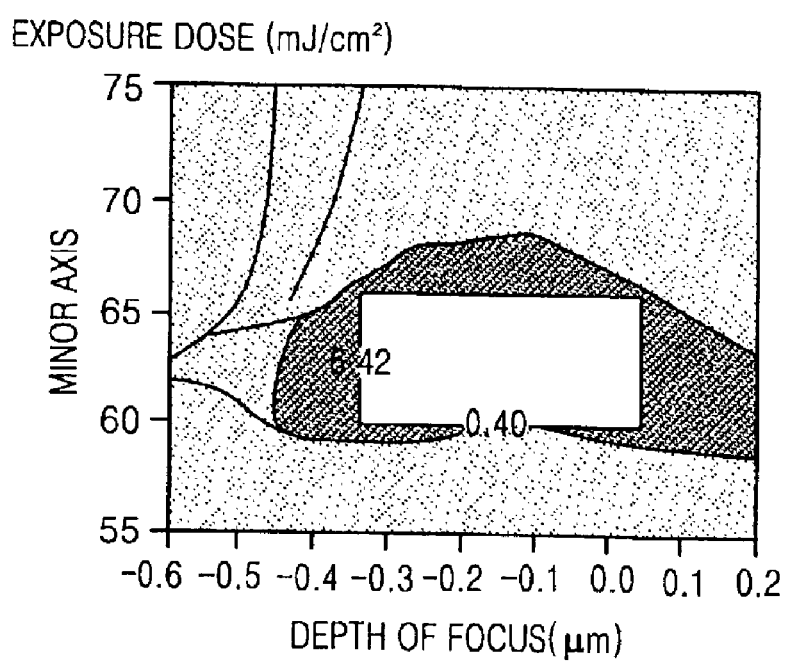
Figure 9B:
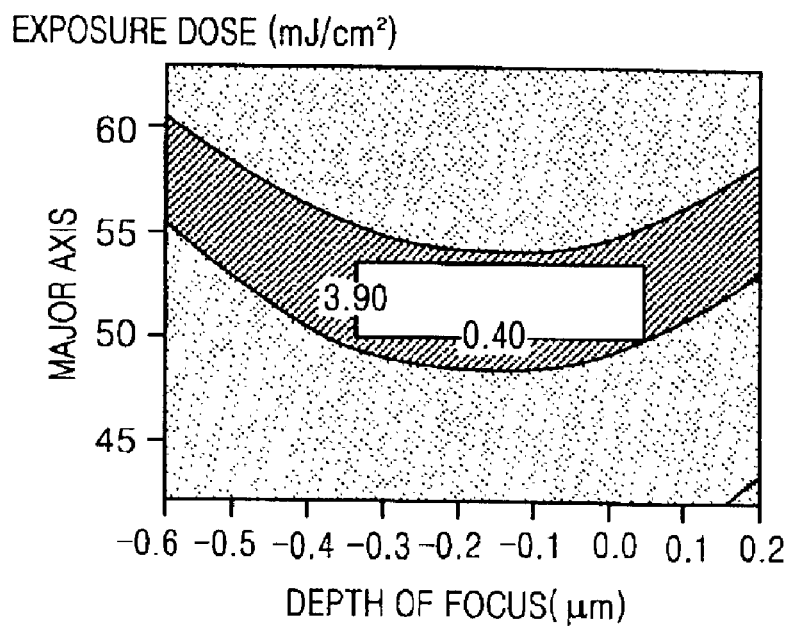
Figure 9B:
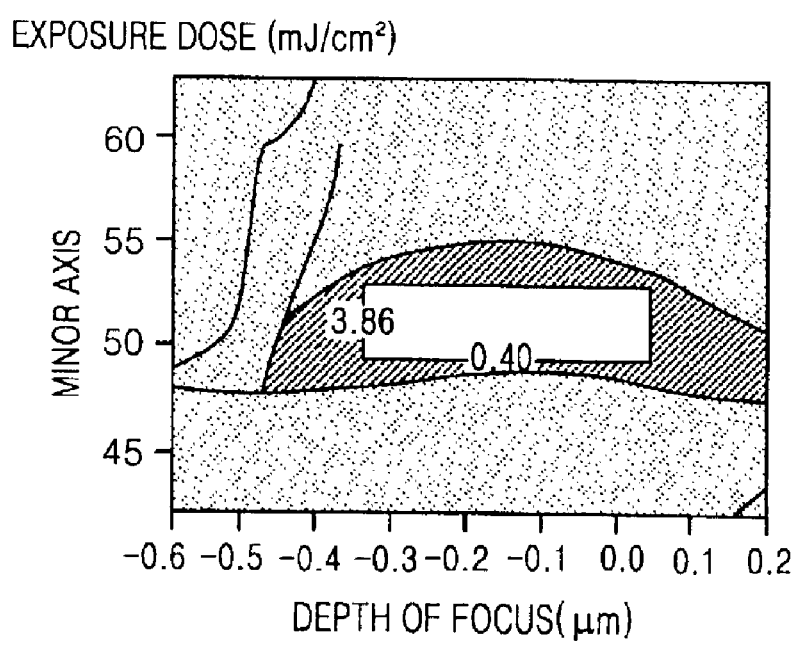
Figure 9C:
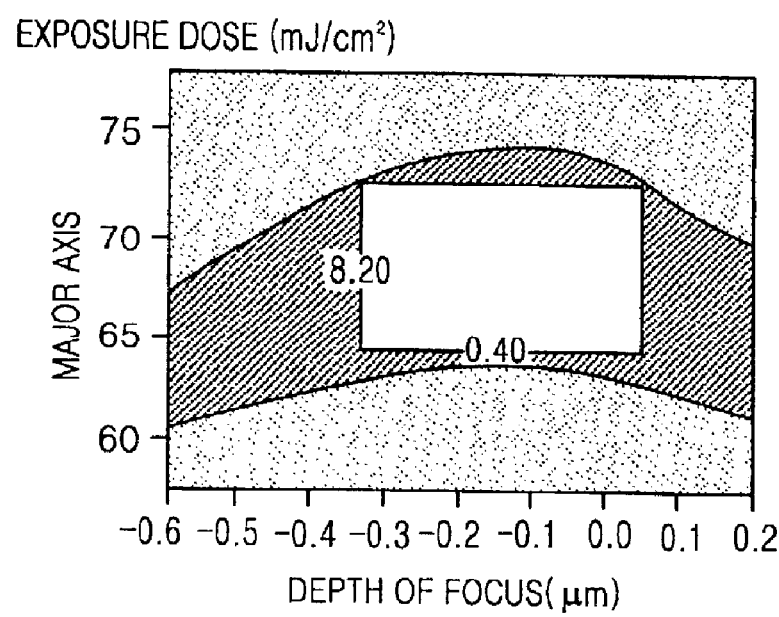
Figure 9C:
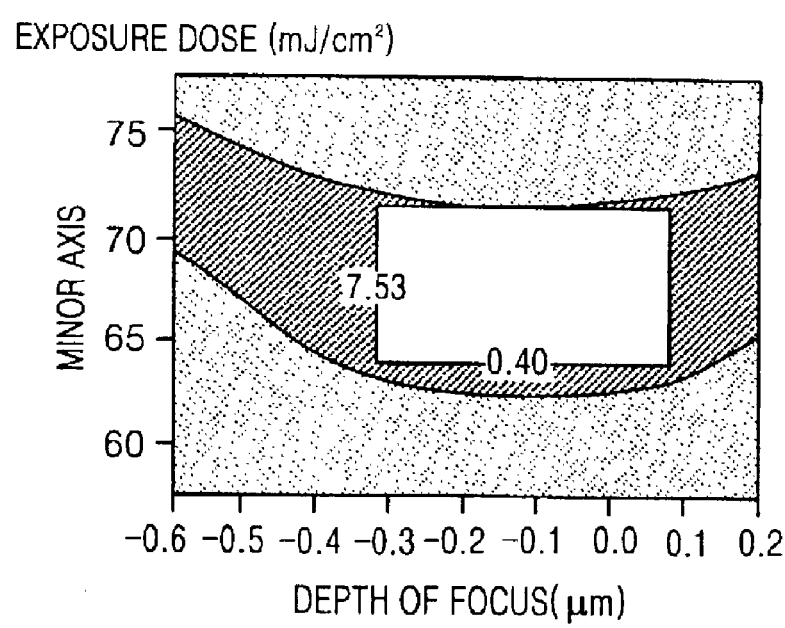

FIGS. 9A through 9C are graphs comparing the implementation of off-axis illumination (OAI) according to an embodiment of the present invention with that of the prior art, in order to verify the effect of obtaining a process margin according to the present invention. X-axes in the graphs denote depth of focus (DOF), and y-axes denote exposure dose. Boxes in the graphs represent process windows. The opaque patterns are of a bar type, having major and minor axes with a 0.292 $\mu$m pitch.

FIG. 9A illustrates a case where OAI is implemented using a quadripole aperture with exposure equipment having 0.7 NA, and a portion with a diameter of 0.55–0.85 $\sigma$ is used as an optical transmission region (marked as 0.85/0.55) when the diameter of the aperture is $\sigma$. That is, the width of the optical transmission region is 0.3 $\sigma$. In such a case, the process margin of overlap of the major axis and minor axis is about 0.4 $\mu$m of DOF and an exposure latitude (EL) of about 10%.

FIG. 9B illustrates a case where OAI is implemented using a quadripole aperture with the exposure equipment having 0.63 NA, lower than that in the case of FIG. 9A. The above condition marked as 0.85/0.55, which is the OAI limit of the exposure equipment having 0.63 NA, is used in FIG. 9B. In this case, in view of the process margin of overlap of the major axis and the minor axis, the EL is about 4%, less than that in FIG. 9A. Mass production is impossible at the above EL.

Meanwhile, FIG. 9C illustrates a case where the OAI conditions are modified as described in FIG. 5 so that OAI is implemented in the outmost region of the aperture while still using exposure equipment having 0.63 NA, lower than that in the case of FIG. 9A without change, from FIG. 9B.

That is, in contrast to FIGS. 9A & 9B, the portion from FIG. 9B having the diameter of 0.7–1 σ is used as the optical transmission region (marked as 1/0.7) so that the width of the optical transmission region is 0.3 σ, which is the same as in the case of FIG. 9A. In such a case, the process margin of overlap of the major axis and the minor axis is similar to that in the case of FIG. 9A. That is, embodiment disclosed above obtains a process margin equal to that of exposure equipment having high NA as shown in FIG. 9A, even when using exposure equipment having low NA.

Accordingly, even though exposure equipment having 0.63 NA, lower than 0.7 NA, is used, the condition marked as 0.85/0.55, which is the OAI limit of the equipment, is modified into the condition marked as 1/0.7, so that OAI is implemented in the outmost region of the aperture, thereby obtaining the same process margin as when using the exposure equipment having 0.7 NA. Most semiconductor companies want to develop new-generation products and mass produce the new-generation products using conventional equipment without additional investment, which means mass producing highly-integrated devices using exposure equipment having a NA as low as possible. This interest can be satisfied using the photomask disclosed herein.

A method of fabricating the photomask will now be described with reference to FIGS. 10A through 10E and 11A through 11F. The method is a technique for forming phase gratings directly on the back surface of a 6-inch transparent substrate, which is generally used as a transparent substrate for a photomask. Through this technique, many considerations can be satisfied; as a design rule becomes smaller, the size of the phase gratings is also reduced, while this is implemented on the transparent substrate, the duty ratio can be controlled precisely to 1:1, and phase can be precisely controlled to obtain a desired phase difference, all with great uniformity.

Figure 10A:
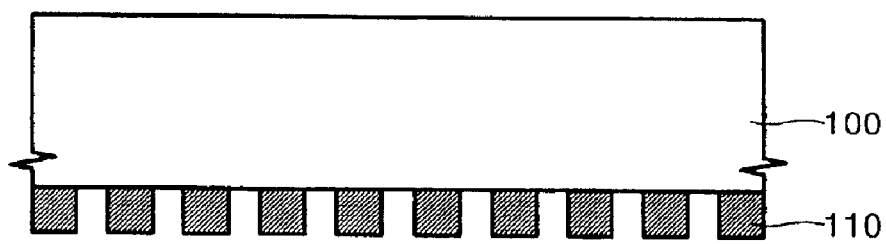
FIGS. 10A through 10E illustrate process steps of fabricating a photomask according to a third embodiment of the present invention.

Referring to FIG. 10A, the plurality of opaque patterns 10 for defining a floodlighting portion for forming patterns are formed on the front surface of the transparent substrate 100.

Figure 10B:
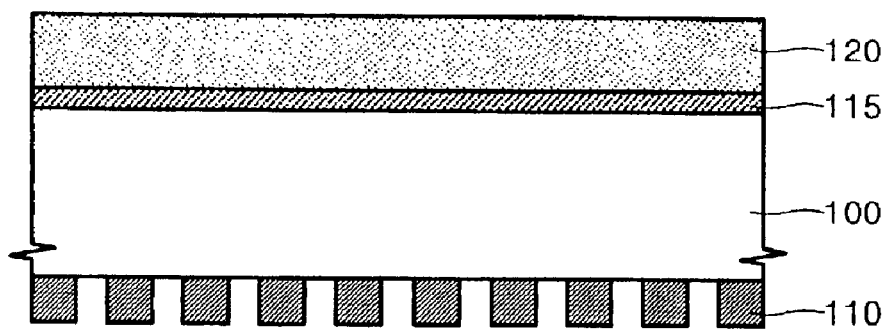

Referring to FIG. 10B, in order to improve the adhesive force of a resist to be coated on the transparent substrate 100, hexamethyldisilazane (HMDS) 115 is processed on the back surface of the transparent substrate 100. Subsequently, the resist 120 is coated on the back surface of the transparent substrate 100. In this case, photoresist or e-beam resist must be selected according to the kind of exposure equipment, that is, whether laser or e-beam is used as a light source. In order to use e-beam exposure equipment, a charging protection layer must be formed on the back surface of the transparent substrate 100 before the resist 120 is coated on the transparent substrate 100, to prevent a charging effect.

Figure 10C:
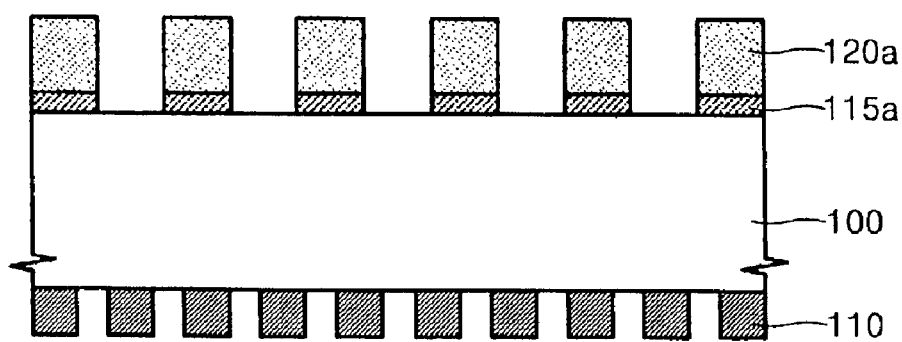

Referring to FIG. 10C, resist patterns 120a are formed so as to obtain desired phase gratings by exposing and developing the resist 120. In this step, the HMDS 115 is also patterned. The phase gratings are formed to allow the off-axis illumination (OAI) of an incident light source beyond the OAI limit of exposure equipment, to allow use in the outmost region of an aperture and provide modified illumination having a shape suitable for the layout of the opaque patterns 110 to be implemented. When data information of the resist patterns 120a that are designed on the surface of the resist 120 is scanned through the laser or e-beam, the characteristics of a polymer chemical combination structure of the resist 120 are physically varied. If spin dispersion or puddle dispersion of the developing solution is used, an exposed resist region is selectively exposed. Processing of the HMDS 115 prevents patterns from being torn when the resist 120 is developed. In an e-beam process, a cleansing process is required to remove resist debris remaining after additional hard-baking firing and developing processes by using plasma.

Figure 10D:
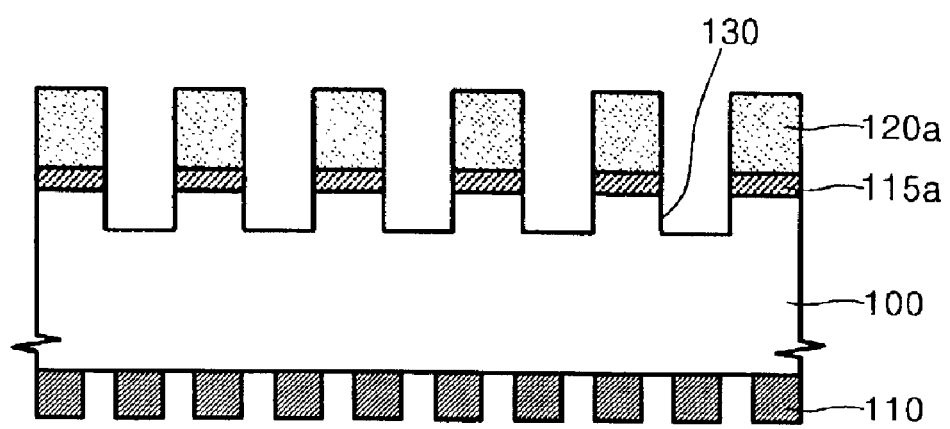
Figure 10E:
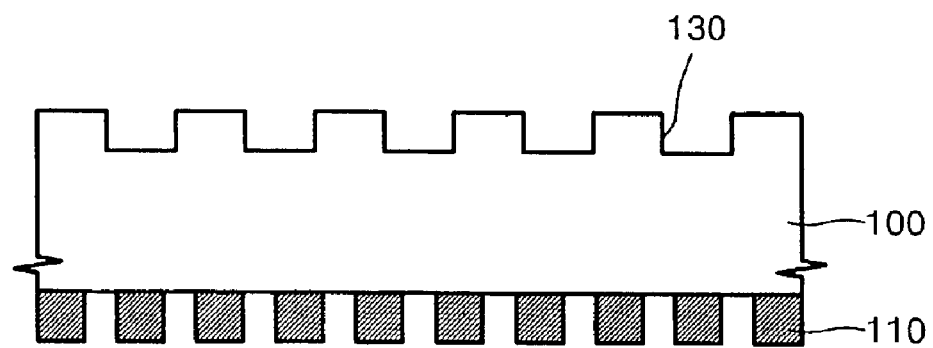

Referring to FIG. 10D, the back surface of the transparent substrate 100 is etched to a predetermined depth using the resist patterns 120a as an etching mask, and thereby the plurality of phase gratings 130 are formed together with the transparent substrate 100 as one body, on the back surface of the transparent substrate 100. Both dry etching and wet etching may be performed to etch the back surface of the transparent substrate 100, and in particular, when using both anisotropic dry etching and isotropic wet etching, the size of the phase gratings can be precisely adjusted, and thereby the duty ratio of the phase gratings can be made precisely 1:1.

The plurality of phase gratings 130 may have aligned edges and may be rectangular patterns arranged in a mosaic shape. In this case, the phase gratings 130 phase-shift incident light by 180°, or by less than 180°. Alternatively, the plurality of phase gratings may have an alternating pattern on lines & spaces at equal intervals and phase-shift the incident light by less than 180°.

The phase-shifted angle is controlled by adjusting the etch depth of the transparent substrate 100. For phase control and improvement of uniformity, the step of etching the back surface of the transparent substrate 100 is divided into a plurality of steps, where the etch rate is calculated in each step, and the calculated etch rate is applied in the subsequent step. As a result, a desired phase difference can be precisely obtained, and the etching time in each step can be properly distributed, preventing deterioration of uniformity due to an increase in an etching time.

As shown in FIG. 1E, the photoresist pattern 120a and the HMDS 115 are removed, completing the fabrication of the photomask on which the phase gratings 130 are formed.

Another method of fabricating the photomask, described with reference to FIGS. 11A through 11F, is generally the same as the method described above, but a chrome layer is formed instead of HMDS processing before e-beam lithography.

Figure 11A:
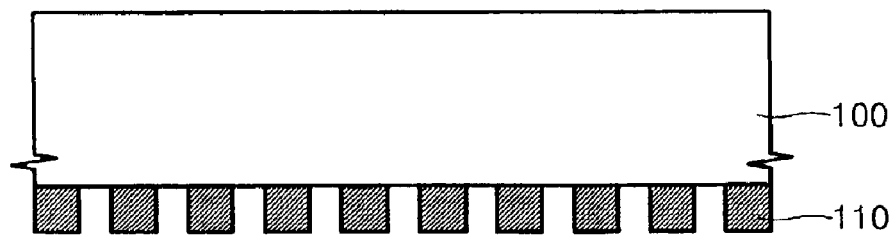
FIGS. 11A through 11F illustrate process steps of fabricating a photomask according to a fourth embodiment of the present invention.

Referring to FIG. 11A, the plurality of opaque patterns 110 for defining a floodlighting portion for forming patterns are formed on the front surface of the transparent substrate 100.

Figure 11B:
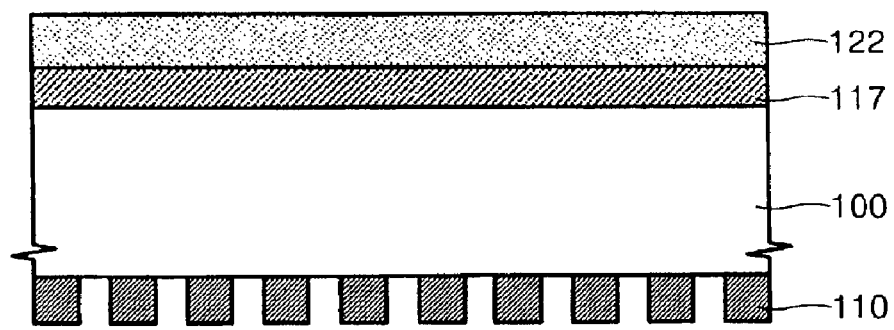

Referring to FIG. 11B, in order to improve the adhesive force of a resist to be coated on the transparent substrate 100, a chrome layer 117 is formed on the back surface of the transparent substrate 100. The chrome layer 117 may be formed through sputtering. Subsequently, c-beam resist 122 is coated on the back surface of the transparent substrate 100.

Figure 11C:
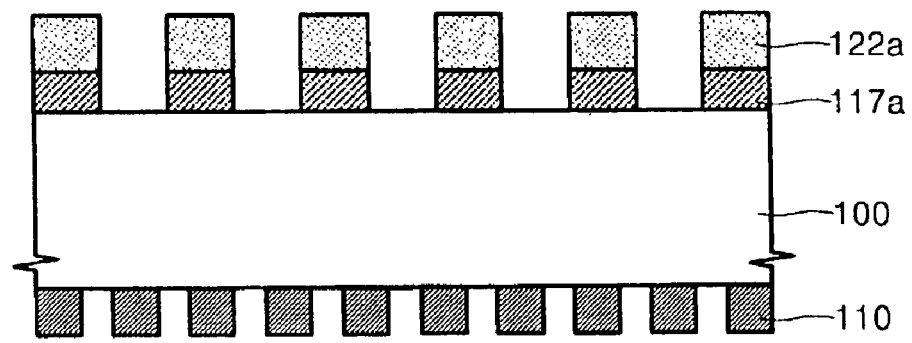
Figure 11D:
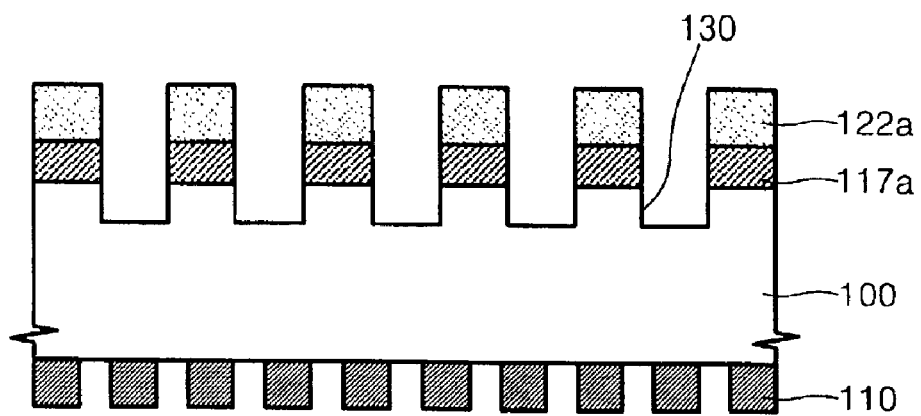

Referring to FIG. 11C, the e-beam resist 122 is exposed and developed, forming e-beam resist patterns 122a for desired phase gratings. This step is performed using e-beam exposure equipment. A cleansing process is also performed.

The chrome layer 117 is etched using the e-beam resist patterns 122a as an etching mask, thereby forming chrome patterns 117a. In this case, the chrome layer 117 is wet-etched and is selectively etched while the e-beam resist patterns 122a serve as a protection layer.

Referring to FIG. 1D, the back surface of the transparent substrate 100 is etched using the chrome patterns 117a and the e-beam resist patterns 122a, and thereby the plurality of phase gratings 130 are formed together with the transparent substrate 100 as one body, on the back surface of the transparent substrate 100.

Figure 11E:
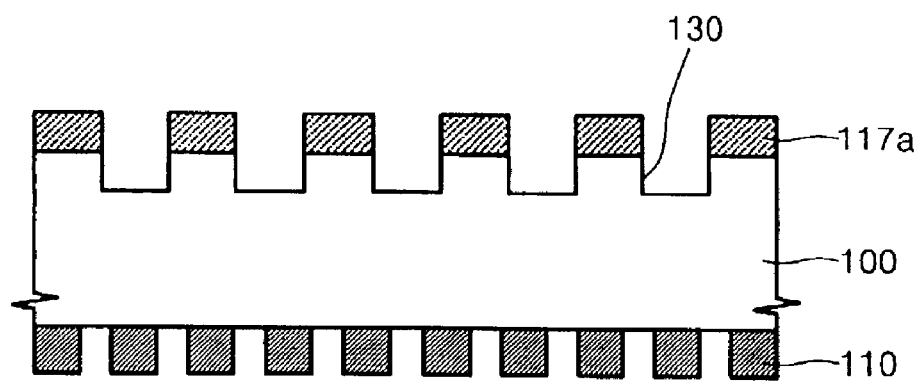
Figure 11F:
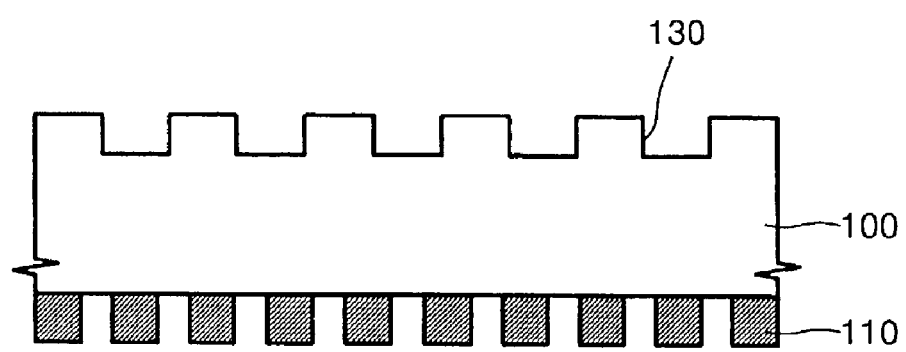

As shown in FIG. 11E, the e-beam resist patterns 122a are removed, and as shown in FIG. 11F, the chrome patterns 117a are removed, completing the fabrication of the photomask.

The above method may be used when a spin on glass (SOG) layer is formed on the back surface of the transparent substrate and then etched, to form phase gratings.

Specifically, the SOG layer is formed on the back surface of the transparent substrate, and then resist is coated on the SOG layer, exposed and developed, thereby forming resist patterns for desired phase gratings. The SOG layer is etched using the resist patterns as an etching mask, and the resist patterns are removed, thereby fabricating the photomask. In this case, in order to improve the adhesive force of the resist to the SOG layer, HMDS may be processed or a chrome layer may be formed.

As described above, the phase gratings are formed on the back surface of the photomask, and a diffraction angle is artificially adjusted, to overcome the OAI limit of the exposure equipment and allow the phase gratings to be used in the outmost region of the aperture while using conventional exposure equipment without change. Thus, the effect of the OAI condition, which cannot be proved in the exposure equipment, can be achieved. Since desired process windows can be obtained even though exposure equipment having low NA is used, high-priced exposure equipment having a high NA is not necessary, and thus, manufacturing cost is greatly reduced.

Since the phase gratings are formed according to the layout of opaque patterns, an optimized OAI effect can be achieved even in opaque patterns of arbitrary layout. Therefore, optical performance and wafer process capability can be improved. Even when patterns have different pitches in an x-direction, a y-direction, and a diagonal direction, instead of a constant pitch like in the alternating line & space layout, a desired CD can be implemented in each direction. Thus, the proper process margin can be obtained.

In addition, the phase gratings are formed together with the photomask as one body, by etching the back surface of a 6-inch photomask, as is generally used as a transparent substrate for photomask, or by etching a SOG layer that is coated on the photomask, to solve conventional problems and allow mass production.

Since the photomask can achieve an off-axis effect, a light transmission area is larger than that of a structure in which a part of light that is transmitted into an illumination system is cut off using a conventional aperture, and thus, the amount of exposure is increased. Accordingly, exposure time is reduced and productivity is improved.

While this invention has been particularly shown and described with reference to preferred embodiments thereof, it will be understood by those skilled in the art that various changes in form and details may be made therein without departing from the spirit and scope thereof as defined by the appended claims.

What is claimed is:

1. A photomask comprising:
   a transparent substrate;
   a plurality of opaque patterns formed on a front surface of the transparent substrate, defining a floodlighting portion for forming patterns; and
   a plurality of phase gratings formed on a back surface of the transparent substrate, adapted to allow off-axis illumination (OAI) of incident light beyond a OAI limit of exposure equipment, to allow use in a outmost region of an aperture and to allow modified illumination having a shape suitable for a layout of the opaque patterns,
   wherein the plurality of phase gratings shift a phase of the incident light by a phase greater than zero and less than 180°.

2. The photomask of claim 1, wherein the plurality of phase gratings have aligned edges and are rectangular patterns arranged in a mosaic shape.

3. The photomask of claim 2, wherein the phase gratings phase-shift incident light by 90°.

4. The photomask of claim 1, wherein the plurality of phase gratings form an alternating line & space pattern.

5. The photomask of claim 1, wherein the opaque patterns are patterns for forming a dynamic random access memory (DRAM).

6. The photomask of claim 1, wherein the phase gratings are formed together with the transparent substrate as one body.

7. The photomask of claim 6, wherein the back surface of the transparent substrate is etched, and thereby the phase gratings are formed.

8. The photomask of claim 6, wherein a material layer having a phase difference that is formed on the back surface of the transparent substrate is etched, and thereby the phase gratings are formed.

9. The photomask of claim 8, wherein the material layer is a spin on glass (SOG) layer.

10. A method of fabricating a photomask, the method comprising:
    forming a plurality of opaque patterns, for defining a floodlighting portion for forming patterns, on a front surface of a transparent substrate; and
    forming a plurality of phase gratings together with the transparent substrate as one body, on a back surface of the transparent substrate, adapted to allow off-axis illumination (OAI) of incident light beyond an OAI limit of exposure equipment, to allow use in an outmost region of an aperture, and to allow modified illumination having a shape suitable the layout of the opaque patterns,
    wherein the plurality of phase gratings phase shift the incident light by a phase greater than zero and less than 180°.

11. The method of claim 10, wherein the step of forming a plurality of phase gratings comprises:
    coating resist on a back surface of the transparent substrate;
    exposing and developing the resist and forming resist patterns for desired phase gratings;
    etching the back surface of the transparent substrate using the resist patterns as an etching mask; and
    removing the resist patterns.

12. The method of claim 11, further comprising processing hexamethyldisilazane (HMDS) on the back surface of the transparent substrate before the step of coating resist.

13. The method of claim 11, further comprising forming a charging protection layer on the back surface of the transparent substrate before the step of coating resist, wherein the step of forming resist patterns is performed using e-beam exposure equipment.

14. The method of claim 11, further comprising:
    forming a chrome layer on the back surface of the transparent substrate, before the step of coating resist; and etching the chrome layer using the resist patterns as an etching mask to form chrome patterns, wherein the step of etching the back surface of the transparent substrate is performed using the chrome patterns and the resist patterns as an etching mask, and the chrome patterns are removed in the step of removing the resist patterns.

15. The method of claim 14, wherein the step of forming resist patterns is performed using e-beam exposure equipment.

16. The method of claim 11, wherein the step of etching the back surface of the transparent substrate is performed using dry etching and wet etching together.

17. The method of claim 11, wherein the step of etching the back surface of the transparent substrate is divided into a plurality of steps, an etch rate is calculated in each step and the calculated etch rate is applied in a subsequent step.

18. The method of claim 11, wherein the step of forming resist patterns is performed using laser exposure equipment.

19. The method of claim 10, wherein the step of forming the phase gratings comprises:

forming a spin on glass (SOG) layer on the back surface of the transparent substrate;

coating resist on the SOG layer;

exposing and developing the resist and forming resist patterns for desired phase gratings; and etching the SOG layer using the resist patterns as an etching mask; and removing the resist patterns.

20. The method of claim 19, further comprising processing hexamethyldisilazane (HMDS) on the SOG layer before the step of coating resist.

21. The method of claim 19, wherein the step of forming resist patterns is performed using laser exposure equipment.

22. The method of claim 19, further comprising forming a charging protection layer on the SOG layer before the step of coating resist, wherein the step of forming resist patterns is performed using e-beam exposure equipment.

23. The method of claim 19, further comprising:

forming a chrome layer on the SOG layer before the step of coating resist; and etching the chrome layer using the resist patterns as an etching mask and forming chrome patterns;

wherein the step of etching the SOG layer is performed using the chrome patterns and the resist patterns as an etching mask, and the chrome patterns are removed in the step of removing the resist patterns.

24. The method of claim 23, wherein the step of forming resist patterns is performed using e-beam exposure equipment.

25. The method of claim 19, wherein the step of etching the SOG layer is performed using dry etching and wet etching together.

26. The method of claim 19, wherein the step of etching the SOG layer is divided into a plurality of steps, an etch rate is calculated in each step and the calculated etch rate is applied in a subsequent step.

27. The method of claim 10, wherein the plurality of phase gratings have aligned edges and are rectangular patterns arranged in a mosaic shape.

28. The method of claim 27, wherein the phase gratings phase-shift incident light by 90°.

29. The method of claim 10, wherein the plurality of phase gratings form an alternating line & space pattern.

30. The method of claim 10, wherein the opaque patterns are patterns for forming a dynamic random access memory (DRAM).

* * * * *